(12) United States Patent
Osada et al.

(10) Patent No.: US 9,190,300 B2
(45) Date of Patent: Nov. 17, 2015

(54) METHOD OF CLEANING SUBSTRATE PROCESSING APPARATUS

(75) Inventors: Naoyuki Osada, Kyoto (JP); Kentaro Sugimoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 808 days.

(21) Appl. No.: 13/450,654

(22) Filed: Apr. 19, 2012

(65) Prior Publication Data

US 2012/0273011 A1 Nov. 1, 2012

(30) Foreign Application Priority Data

Apr. 27, 2011 (JP) ................. 2011-099148

(51) Int. Cl.
*B08B 7/00* (2006.01)
*H01L 21/67* (2006.01)

(52) U.S. Cl.
CPC .................. *H01L 21/67051* (2013.01)

(58) Field of Classification Search
None
See application file for complete search history.

(56) References Cited

U.S. PATENT DOCUMENTS

| | | | |
|---|---|---|---|
| 2008/0142051 A1 | 6/2008 | Hashizume | |
| 2009/0074402 A1 | 3/2009 | Miyagi et al. | |
| 2010/0144158 A1 | 6/2010 | Ito et al. | |

FOREIGN PATENT DOCUMENTS

| | | |
|---|---|---|
| CN | 101204708 | 6/2008 |
| JP | 9-232276 | 9/1997 |
| JP | 2000-294531 | 10/2000 |
| JP | 2001-127033 | 5/2001 |
| JP | 2001-334220 | 12/2001 |
| JP | 2002170804 A * | 6/2002 |
| JP | 2004-111487 | 4/2004 |
| JP | 2006-159011 | 6/2006 |
| JP | 2008-153521 | 7/2008 |
| JP | 2009-071028 | 4/2009 |
| JP | 2010-157528 | 7/2010 |
| KR | 10-0930149 | 12/2009 |

OTHER PUBLICATIONS

JPO machine translation of JP 2002-170804 retrieved from http://www19.ipdl.inpit.go.jp/PA1/cgi-bin/PA1DETAIL and http://www4.ipdl.inpit.go.jp/Tokujitu/PAJdetail.ipdl?N0000=60&N0120=01&N2001=2&N3001=2002-170804 on Mar. 9, 2015.*

Office Action issued by Korean Patent Office on Jul. 15, 2013 in connection with corresponding Korean Patent Application No. 10-2012-0040890 with Japanese and English Translation thereof.

Office Action issued by Chinese Patent Office on Jan. 4, 2015 in connection with corresponding Chinese Patent Application No. 201210128926.X with English & Japanese Translations thereof.

(Continued)

*Primary Examiner* — Eric Golightly
(74) *Attorney, Agent, or Firm* — Ostrolenk Faber LLP

(57) ABSTRACT

A spin base is caused to rotate at a number of revolutions of from 250 rmp to 350 rpm (first number of revolutions), and at the same time, a cleaning solution is supplied to a holding surface of a spin base while the upper end of a processing cup is placed below the holding surface. Thus, an outer upper surface of the processing cup is cleaned with the cleaning solution scattered from the holding surface. Then, the spin base is caused to rotate at a number of revolutions of from 350 rpm to 450 rpm (second number of revolutions) higher than the first number of revolutions, and at the same time, a cleaning solution is supplied onto the holding surface. Thus, a partition plate outside the processing cup is cleaned with the cleaning solution scattered from the rotating holding surface.

8 Claims, 10 Drawing Sheets

(56) References Cited

OTHER PUBLICATIONS

Office Action issued by Chinese Patent Office on May 6, 2014 in connection with corresponding Chinese Patent Application No. 201210128926.X with English Translation thereof.
Office Action issued by Taiwanese Patent Office on May 28, 2014 in connection with corresponding Taiwanese Patent Application No. 101111745 with English Translation thereof.
Office Action issued by Japanese Patent Office on Apr. 28, 2015 in connection with corresponding Japanese Patent Application No. 2011-099148 with English Translation thereof.
Office Action issued by Chinese Patent Office on Jul. 10, 2015 in connection with corresponding Chinese Patent Application No. 2012-10128926 with English Translation thereof.

* cited by examiner

F I G . 4
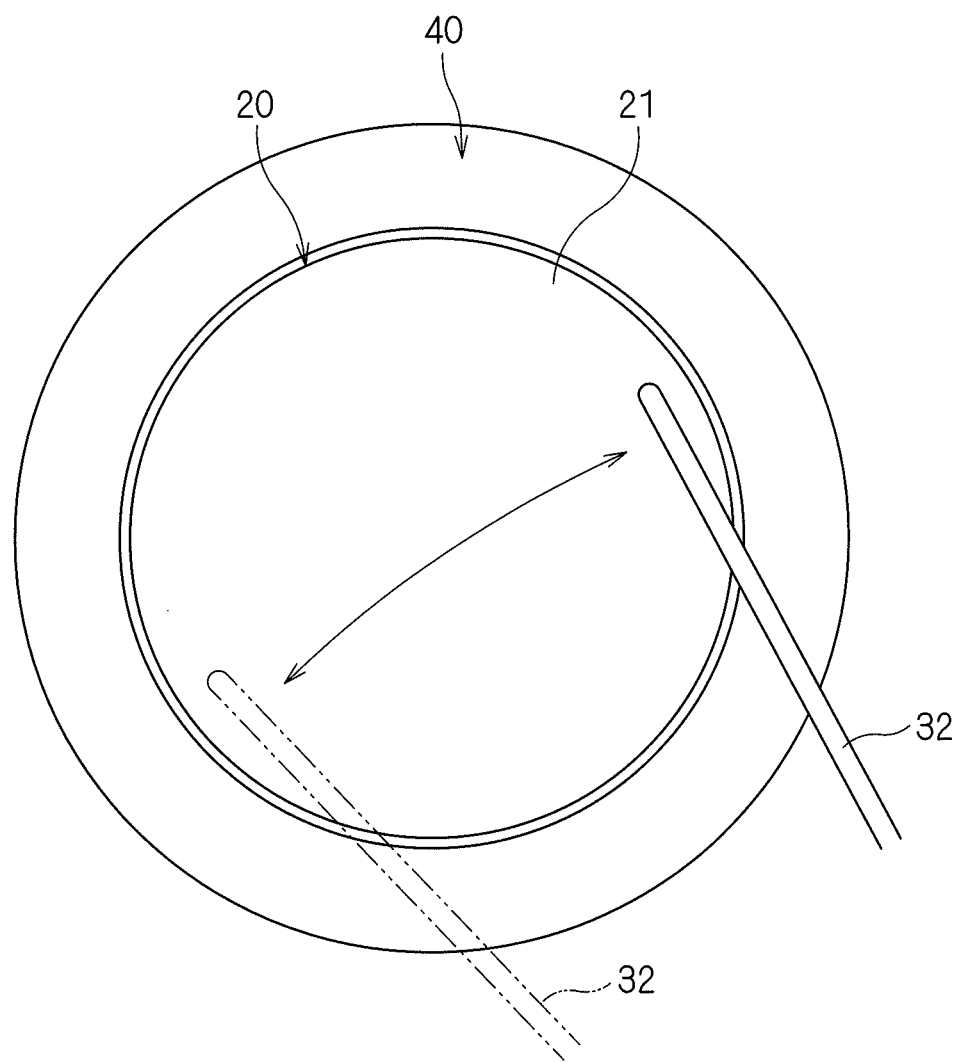

F I G. 5
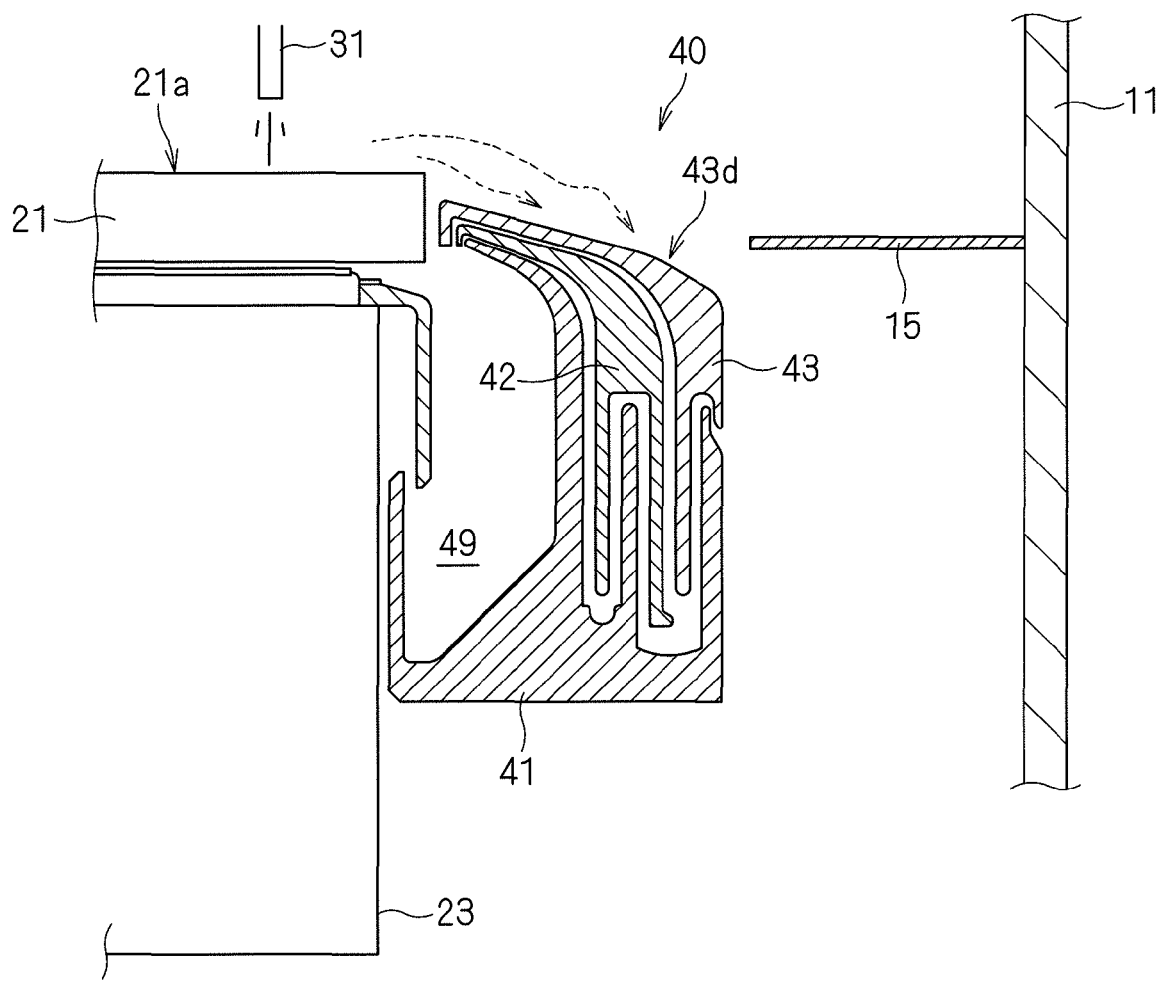

F I G. 6
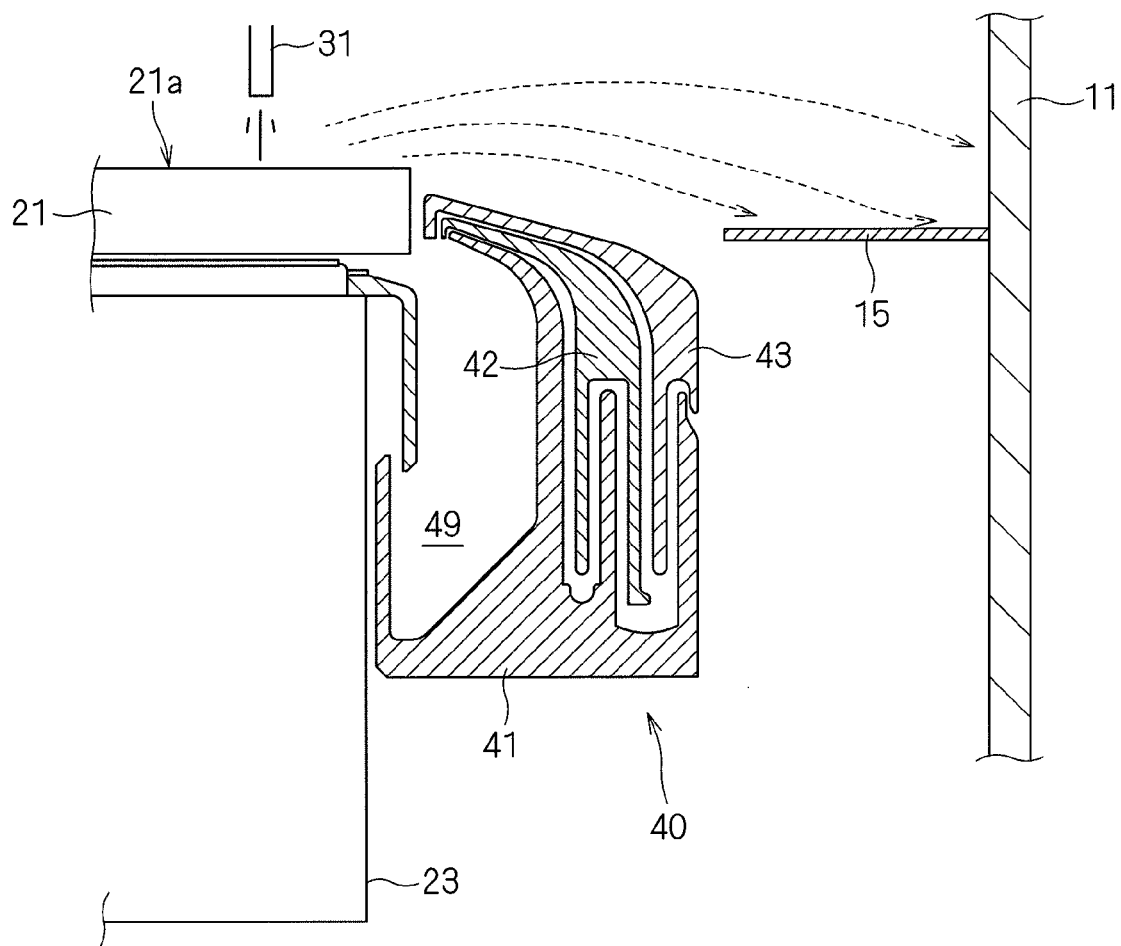

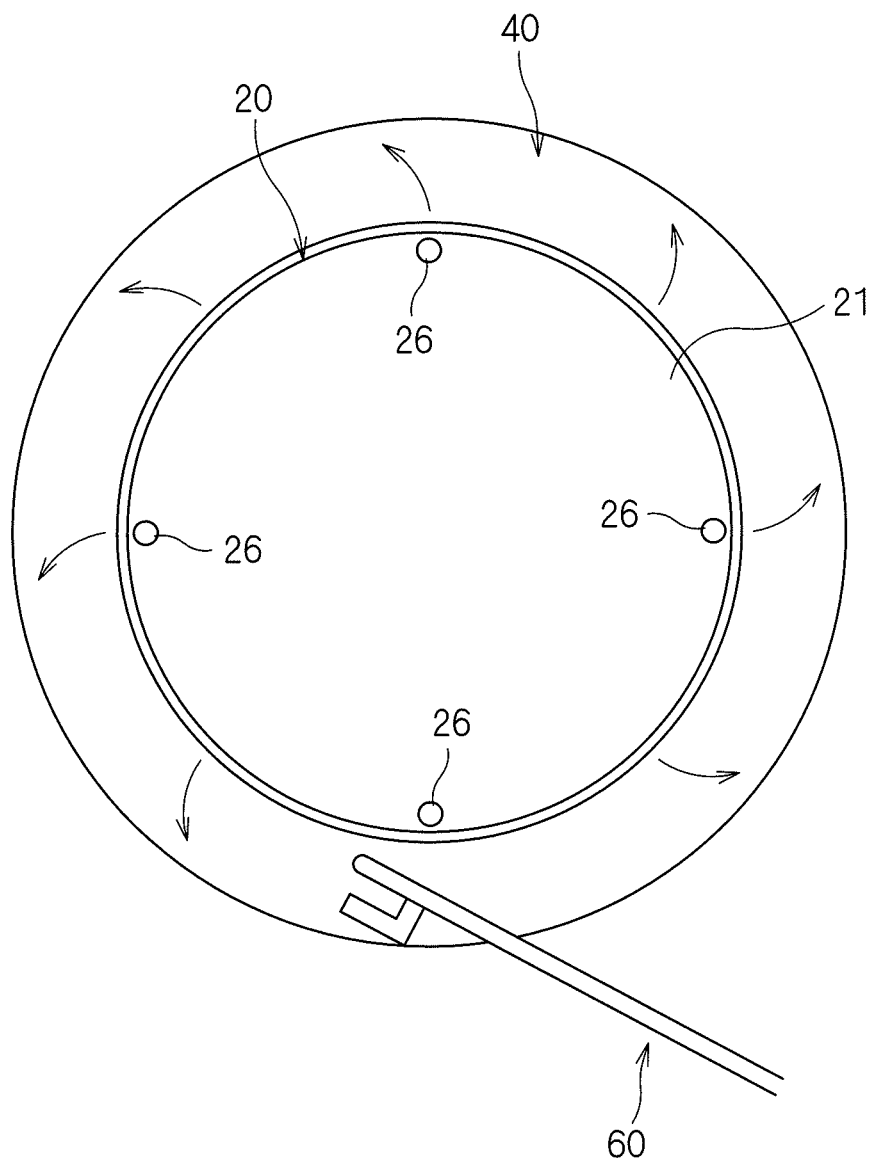

METHOD OF CLEANING SUBSTRATE PROCESSING APPARATUS

BACKGROUND OF THE INVENTION

1. Field of the Invention

The present invention relates to a method of cleaning a substrate processing apparatus that supplies a processing solution to a precision electronic substrate in the form of a thin plate (hereinafter simply called a "substrate") such as a semiconductor wafer or a glass substrate for a liquid crystal display.

2. Description of the Background Art

A substrate processing apparatus conventionally employed in a process of manufacturing substrates performs surface processing of substrates including process with a chemical solution and rising process with de-ionized water, and subsequent drying process. Such a substrate processing apparatus includes an apparatus employing a single-wafer system of processing substrates one by one, and an apparatus employing a batch system of processing a plurality of substrates at the same time. Generally, the substrate processing apparatus of the single-wafer system performs process with a chemical solution by supplying a chemical solution to a surface of a rotating substrate, rinsing process with de-ionized water by supplying de-ionized water, and subsequent spin-drying process by causing the substrate to rotate at high speed. Such a substrate processing apparatus of the single-water system is disclosed for example in US 2008/0078428 and in Japanese Patent Application Laid-Open No. 2010-192686, for example.

The substrate processing apparatus disclosed in these publications includes a spin chuck causing a substrate to rotate held in a substantially horizontal position thereon, a nozzle from which a processing solution is supplied to the upper surface of the substrate held on the spin chuck, and a cup surrounding the spin chuck and provided to receive the processing solution scattered from the substrate. The apparatus disclosed in Japanese Patent Application Laid-Open No. 2010-192686 additionally includes a processing chamber housing these components, and a partition plate around the cup provided to divide the processing chamber into parts, one above the other.

This apparatus of the single-wafer system performs surface processing by supplying a processing solution to a rotating substrate, so the processing solution is scattered from the substrate by centrifugal force. Most of the scattered processing solution is collected in the cup surrounding the spin chuck. Meanwhile, part of the scattered processing solution converted into mist form may be scattered as far as to an outer wall surface of the cup or to surroundings of the cup, and then attached to the outer wall surface or the surroundings of the cup. This processing solution scattered outside the cup may become a source of pollution after it is dried.

So, the processing solution attached to the outer wall surface of the cup or to a member around the cup should be cleared where appropriate. The processing solution attached to the part outside the cup may be cleared by a special-purpose mechanism such as a nozzle from which de-ionized water is supplied to the part outside the cup or a nozzle from which nitrogen gas is sprayed for drying that is provided in addition to a nozzle for substrate processing. However, it is difficult to provide such a special-purpose mechanism in a substrate processing apparatus required to be reduced in size.

SUMMARY OF THE INVENTION

The present invention is intended for a method of cleaning a substrate processing apparatus that performs substrate processing with a processing solution.

According to one aspect of the present invention, the method includes the following steps (a) and (b). In the step (a), a substrate holding element is caused to rotate at a first number of revolutions, the substrate holding element having a holding surface facing the lower surface of a substrate to be held on the substrate holding element, and at the same time, a cleaning solution is supplied from a cleaning solution supply nozzle onto the holding surface while the upper end of a cup surrounding the substrate holding element is placed below the substrate holding element, thereby cleaning an outer upper surface of the cup with the cleaning solution scattered from the holding surface while the holding surface is rotating. In the step (b), the substrate holding element is caused to rotate at a second number of revolutions higher than the first number of revolutions, and at the same time, a cleaning solution is supplied from the cleaning solution supply nozzle onto the holding surface, thereby cleaning an area outside the cup and surrounding the cup with the cleaning solution scattered from the holding surface while the holding surface is rotating.

The outer upper surface of the cup and the area outside the cup are cleaned only by a mechanism for performing surface processing on a substrate, making it possible to clean the upper surface of the cup and surroundings of the cup without requiring a special-purpose cleaning mechanism.

Preferably, the cleaning solution supply nozzle for supplying a cleaning solution is caused to move over the holding surface.

This allows the upper surface of the cup and a wide area surrounding the cup to be cleaned favorably.

The method may include the step of drying the outer upper surface of the cup and the area outside the cup with airflow generated by causing the substrate holding element to rotate at a fourth number of revolutions higher than the second number of revolutions. Preferably, in this step, gas is discharged from a gas supply nozzle onto at least the outer upper surface of the cup.

This allows increase of efficiency of drying.

Thus, an object of the present invention is to clean the upper surface of the cup and surroundings of the cup in the substrate processing apparatus without the need of preparing a special-purpose cleaning mechanism.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows the reciprocating movement of an upper processing solution nozzle;

FIG. 5 shows how an outer upper surface of a processing cup is cleaned;

FIG. 6 shows how a partition plate and a side wall of a chamber are cleaned;

FIG. 10 shows drying process.

DESCRIPTION OF THE PREFERRED EMBODIMENTS

Figure 1:
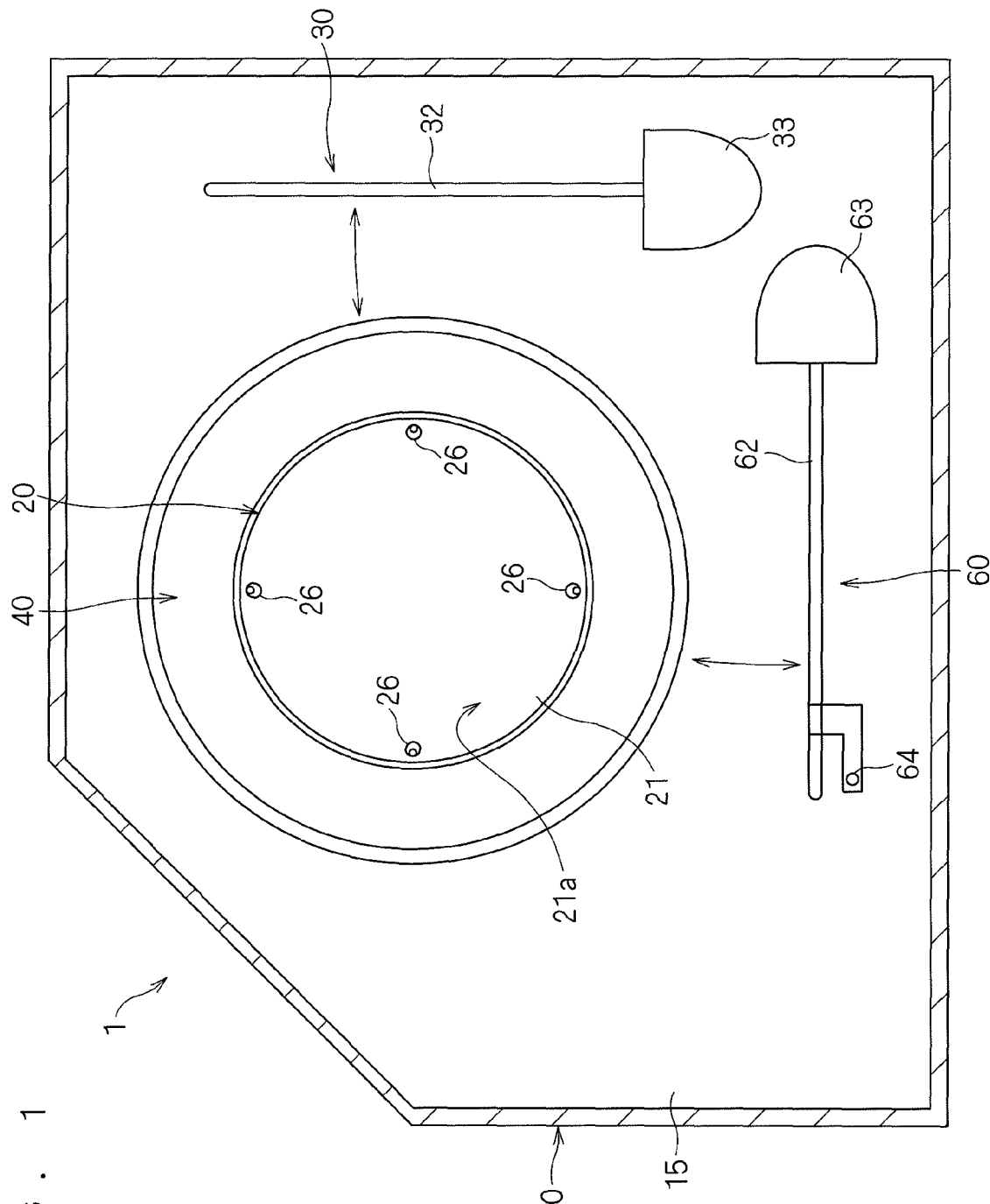
FIG. 1 is a plan view of a substrate processing apparatus targeted for cleaning in a cleaning method of the present invention.

A preferred embodiment of the present invention is described in detail below by referring to the drawings.

Figure 2:
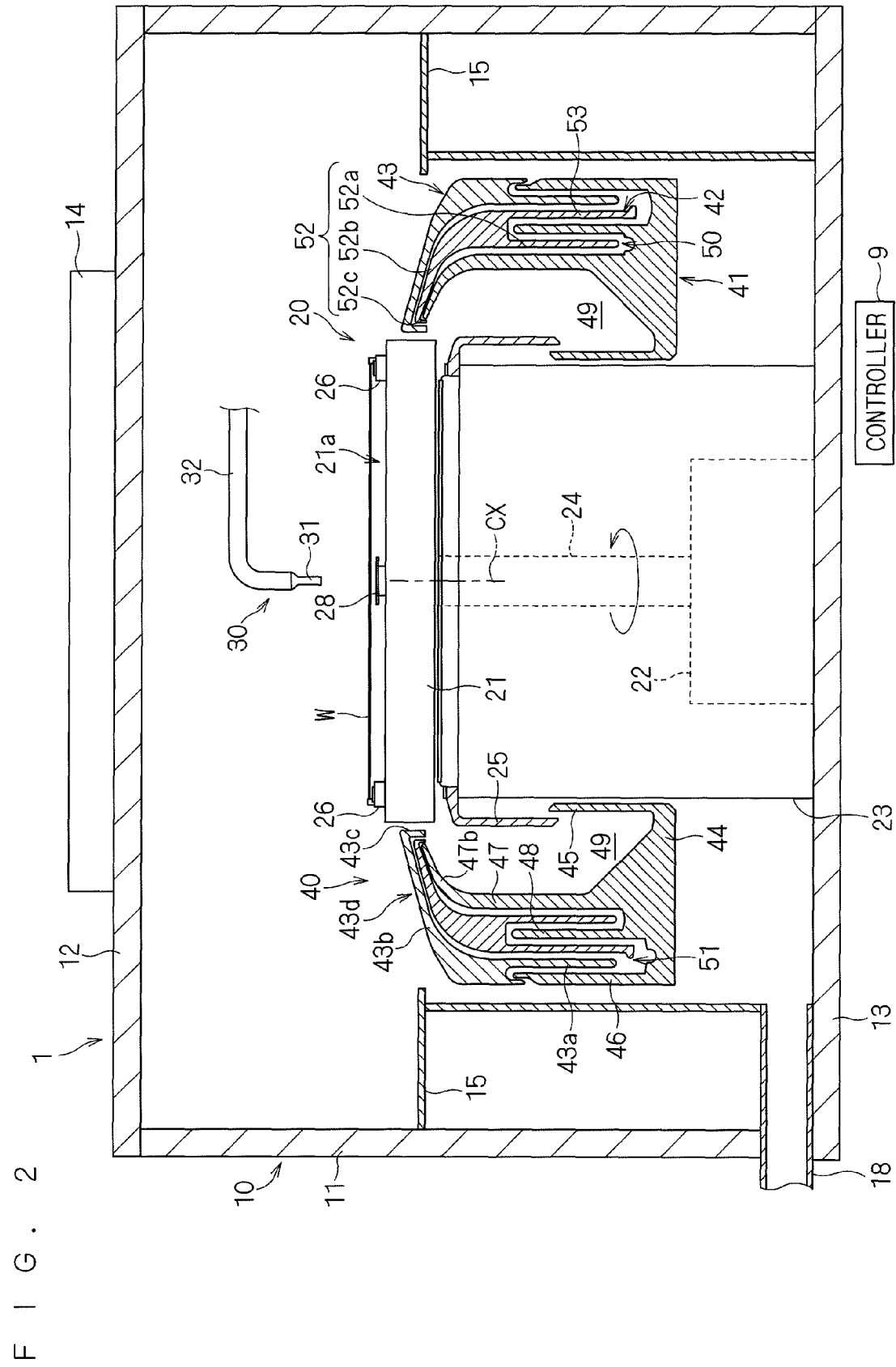
FIG. 2 is a vertical sectional view of the substrate processing apparatus shown in FIG. 1.

FIG. 1 is a plan view of a substrate processing apparatus 1 targeted for cleaning in a cleaning method of the present invention. FIG. 2 is a vertical sectional view of the substrate processing apparatus 1. The substrate processing apparatus 1 is a processing apparatus employing a single-water system of processing semiconductor substrates W one by one. The substrate processing apparatus 1 performs process with a chemical solution and rinsing process with de-ionized water on a circular silicon substrate W, and then performs drying process on the substrate W. FIG. 1 shows a condition where a substrate W is not held on a spin chuck 20. FIG. 2 shows a condition where a substrate W is held on the spin chuck 20.

Main components of the substrate processing apparatus 1 housed in a chamber 10 include the spin chuck 20 on which a substrate W is held in a horizontal position (position that makes the normal of the substrate W extend in the vertical direction), an upper processing solution nozzle 30 through which a processing solution is supplied onto the upper surface of the substrate W held on the spin chuck 20, and a processing cup 40 surrounding the spin chuck 20. A partition plate 15 is provided around the processing cup 40 in the chamber 10. The partition plate 15 divides the space inside the chamber 10 into parts, one above the other. In the present specification, a processing solution is a generic term for a chemical solution and de-ionized water.

The chamber 10 has a side wall 11 extending in the vertical direction, a ceiling wall 12 enclosing space from above surrounded by the side wall 11, and a floor wall 13 enclosing the space from below. The space surrounded by the side wall 11, the ceiling wall 12, and the floor wall 13 functions as processing space for a substrate W. Further, part of the side wall 11 of the chamber 10 is given a port through which a substrate W is transferred into the chamber 10 and out of the chamber 10, and a shutter to open and close the port (both the port and the shutter are not shown in the drawings).

The ceiling wall 12 of the chamber 10 is provided with a fan filter unit (FFU) 14 that improves the cleanness of air in a clean room in which the substrate processing apparatus 1 is placed, and supplies the cleaned air into the processing space in the chamber 10. The fan filter unit 14 includes a fan for taking the air inside the clean room and feeding the air into the chamber 10, and a filter (such as a HEPA filter), and forms a downflow of the cleaned air in the processing space in the chamber 10. A punching plate with many blowholes may be provided directly below the ceiling wall 12 in order to realize uniform distribution of the cleaned air supplied from the fan filter unit 14.

The spin chuck 20 includes a spin base 21 in the form of a circular disk fixed in a horizontal position to the upper end of a rotary shaft 24 extending in the vertical direction, a spin motor 22 provided below the spin base 21 and which causes the rotary shaft 24 to rotate, and a cylindrical cover member 23 surrounding the spin motor 22. The outer diameter of the spin base 21 in the form of a circular disk is slightly larger than the diameter of a circular substrate W held on the spin chuck 20. So, a holding surface 21a of the spin base 21 is to face the entire lower surface of a substrate W to be held on the spin base 21.

A plurality of (in the preferred embodiment, four) chuck members 26 is provided in upright positions at peripheral edges of the holding surface 21a of the spin base 21. The chuck members 26 are uniformly spaced (if four chuck members 26 are provided as in the preferred embodiment, they are spaced at intervals of 90 degrees) along a circumference corresponding to the outer circumference of a circular substrate W. The chuck members 26 are driven in synchronization with each other by a link mechanism not shown in the drawings housed in the spin base 21. The spin chuck 20 makes abutting contact of each of the chuck members 26 with a corresponding peripheral edge to grasp a substrate W, thereby holding the substrate W in a horizontal position above the spin base 21 and near the holding surface 21a (see FIG. 2). The spin chuck 20 also separates each of the chuck members 26 from a corresponding peripheral edge of the substrate W, thereby releasing the substrate W from the grasp.

The cover member 23 covering the spin motor 22 has a lower end fixed to the floor wall 13 of the chamber 10, and an upper end reaching as far as to a position directly below the spin base 21. An upper end portion of the cover member 23 is provided with a flange member 25 projecting in a substantially horizontal position outward of the cover member 23, and further being downward. While the spin chuck 20 holds a substrate W by causing the chuck members 26 to grasp the substrate W, the spin motor 22 causes the rotary shaft 24 to rotate, thereby allowing the substrate W to rotate about an axis of rotation CX extending in the vertical direction and passing through the center of the substrate W. A controller 9 controls drive of the spin motor 22.

The upper processing solution nozzle 30 is composed of a nozzle arm 32, and a discharge head 31 attached to the tip end of the nozzle arm 32. The base end of the nozzle arm 32 is fixedly coupled to a nozzle base 33. A motor not shown in the drawings allows pivotal movement of the nozzle base 33 about an axis extending in the vertical direction. The pivotal movement of the nozzle base 33 causes the discharge head 31 of the upper processing solution nozzle 30 to move horizontally in an arcuate pattern between a processing position over the spin chuck 20 and a standby position outside the processing cup 40. The upper processing solution nozzle 30 is configured to receive processing solutions of several types (including at least de-ionized water). A processing solution discharged at the processing position through the discharge head 31 of the upper processing solution nozzle 30 reaches the upper surface of a substrate W held on the spin chuck 20. Further, the pivotal movement of the nozzle base 33 allows the upper processing solution nozzle 30 to swing over the holding surface 21a of the spin base 21.

A lower processing solution nozzle 28 is provided that extends in the vertical direction inside the rotary shaft 24. An opening at the upper end of the lower processing solution nozzle 28 is placed at a position opposite the center of the lower surface of a substrate W held on the spin chuck 20. The lower processing solution nozzle 28 is also configured to receive processing solutions of several types. A processing solution discharged from the lower processing solution nozzle 28 reaches the lower surface of a substrate W held on the spin chuck 20.

The substrate processing apparatus 1 includes a two-fluid nozzle 60 in addition to the upper processing solution nozzle 30. The two-fluid nozzle 60 is a cleaning nozzle that generates droplets by mixing a cleaning solution such as de-ionized water and pressurized gas, and sprays the mixed fluid of the droplets and the gas onto a substrate W. The two-fluid nozzle 60 has a liquid head not shown in the drawings attached to the tip end of a nozzle arm 62, and a gas head 64 attached to a support member branching off the nozzle arm 62. The base end of the nozzle arm 62 is fixedly coupled to a nozzle base 63. A motor not shown in the drawings allows pivotal movement of the nozzle base 63 about an axis extending in the vertical direction. The pivotal movement of the nozzle base 63 causes the two-fluid nozzle 60 to move horizontally in an arcuate pattern between a processing position above the spin chuck 20 and a standby position outside the processing cup 40. The liquid head receives a cleaning solution such as de-ionized water, and the gas head 64 receives a pressurized inert gas (in the preferred embodiment, nitrogen ($N_2$) gas). A mixed fluid of a cleaning solution spouted out of the two-fluid nozzle 60 at the processing position is sprayed onto the upper surface of a substrate W held on the spin chuck 20.

The processing cup 40 surrounding the spin chuck 20 includes an inner cup 41, a middle cup 42, and an outer cup 43 that are capable of moving up and down independently of each other. The inner cup 41 has a shape surrounding the spin chuck 20, and exhibiting substantially rotational symmetry about the axis of rotation CX passing through the center of a substrate W held on the spin chuck 20. The inner cup 41 has a bottom section 44 having a toroidal shape in plan view, a cylindrical inner wall section 45 extending upward from an inner periphery of the bottom section 44, a cylindrical outer wall section 46 extending upward from an outer periphery of the bottom section 44, a first guide section 47 extending upward from a position between the inner and outer wall sections 45 and 46 and having an upper end portion that extends obliquely upward in the pattern of a smooth circular arc toward the center (in a direction to get closer to the axis of rotation CX of a substrate W held on the spin chuck 20), and a cylindrical middle wall section 48 extending upward from a position between the first guide section 47 and the outer wall section 46.

Figure 9:
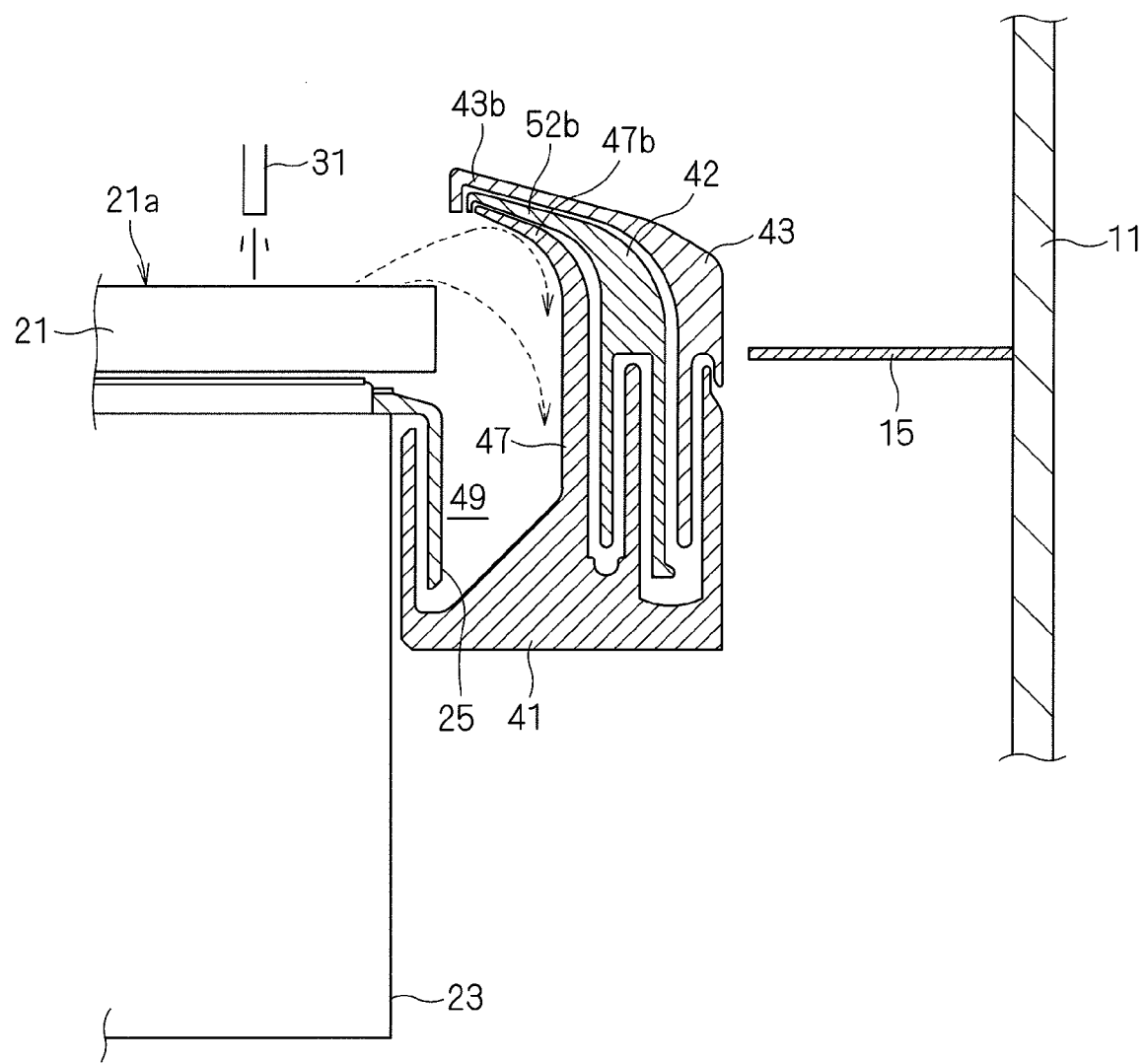
FIG. 9 shows how the inner side of an inner cup is cleaned.

The inner wall section 45 has a length that places the inner wall section 45 between the cover member 23 and the flange member 25 with appropriate clearance left therebetween when the inner cup 41 is at its highest position (see FIG. 9). The middle wall section 48 has a length that places the middle wall section 48 between a second guide section 52 of the middle cup 42 and a processing solution dividing wall 53 described later with appropriate clearance left therebetween when the inner and middle cups 41 and 42 are at their closest positions.

The first guide section 47 has an upper end portion 47b that extends obliquely upward in the pattern of a smooth circular arc toward the center (in a direction to get closer to the axis of rotation CX of a substrate W). A disposal slot 49 is formed between the inner wall section 45 and the first guide section 47 in which a used processing solution is collected and disposed of. A toroidal inner recovery slot 50 is formed between the first guide section 47 and the middle wall section 48 in which a used processing solution is collected and recovered. Also, a toroidal outer recovery slot 51 is formed between the middle and outer wall sections 48 and 46 in which a used processing solution of a type different from that collected in the inner recovery slot 50 is collected and recovered.

The disposal slot 49 discharges a processing solution collected in the disposal slot 49. The disposal slot 49 is connected to a discharge mechanism not shown in the drawings that forcibly extracts air from the disposal slot 49. As an example, four discharge mechanisms are provided that are uniformly spaced in the circumferential direction of the disposal slot 49. Further, recovery mechanisms (both of which are not shown in the drawings) are connected to the inner and outer recovery slots 50 and 51 by which processing solutions collected in the inner and outer recovery slots 50 and 51 respectively are recovered in a recovery tank provided outside the substrate processing apparatus 1. Respective bottom portions of the inner and outer recovery slots 50 and 51 are tilted at slight angles with respect to the horizontal direction, and the respective recovery mechanisms are connected to the lowest positions of the bottom portions. This allows smooth recovery of processing solutions flowing into the inner and outer recovery slots 50 and 51.

The middle cup 42 has a shape surrounding the spin chuck 20, and exhibiting substantially rotational symmetry about the axis of rotation CX passing through the center of a substrate W held on the spin chuck 20. The middle cup 42 has the integrally formed second guide section 52, and the cylindrical processing solution dividing wall 53 coupled to the second guide section 52.

The second guide section 52 is placed outside the first guide section 47 of the inner cup 41. The second guide section 52 has a cylindrical lower end portion 52a coaxial with a lower end portion of the first guide section 47, an upper end portion 52b extending obliquely upward from the upper end of the lower end portion 52a in the pattern of a smooth circular arc toward the center (in a direction to get closer to the axis of rotation CX of a substrate W), and a bent portion 52c formed by bending the tip end of the upper end portion 52b downward. The lower end portion 52a is placed in the inner recovery slot 50 with appropriate clearance left between the first guide section 47 and the middle wall section 48 when the inner and middle cups 41 and 42 are at their closest positions. The upper end portion 52b is arranged to cover the upper end portion 47b of the first guide section 47 of the inner cup 41 from above. The upper end portion 52b is close to the upper end portion 47b of the first guide section 47 with slight clearance left therebetween when the inner and middle cups 41 and 42 are at their closest positions. The bent portion 52c formed by bending the tip end of the upper end portion 52b downward has a length that makes the bent portion 52c cover the tip end of the upper end portion 47b of the first guide section 47 from the side when the inner and middle cups 41 and 42 are at their closest positions.

The upper end portion 52b of the second guide section 52 becomes thicker with approach toward its bottom. The processing solution dividing wall 53 has a cylindrical shape extending downward from a peripheral portion at the lower end of the upper end portion 52b. The processing solution dividing wall 53 is placed in the outer recovery slot 51 with appropriate clearance left between the middle wall section 48 and the outer cup 43 when the inner and middle cups 41 and 42 are at their closest positions.

The outer cup 43 is provided outside the second guide section 52 of the middle cup 42. The outer cup 43 has a shape surrounding the spin chuck 20, and exhibiting substantially rotational symmetry about the axis of rotation CX passing through the center of a substrate W held on the spin chuck 20. The outer cup 43 functions as a third guide section. The outer cup 43 has a cylindrical lower end portion 43a coaxial with the lower end portion 52a of the second guide section 52, an upper end portion 43b extending obliquely upward from the upper end of the lower end portion 43a in the pattern of a smooth circular arc toward the center (in a direction to get closer to the axis of rotation CX of a substrate W), and a bent portion 43c formed by bending the tip end of the upper end portion 43b downward.

The lower end portion 43a is placed in the outer recovery slot 51 with appropriate clearance left between the processing solution dividing wall 53 of the middle cup 42 and the outer wall section 46 of the inner cup 41 when the inner and outer cups 41 and 43 are at their closest positions. The upper end portion 43b is arranged to cover the second guide section 52 of the middle cup 42 from above. The upper end portion 43b is close to the upper end portion 52b of the second guide section 52 with slight clearance left therebetween when the middle and outer cups 42 and 43 are at their closest positions. The bent portion 43c formed by bending the tip end of the upper end portion 43b downward has a length that makes the bent portion 43c cover the bent portion 52c of the second guide section 52 from the side when the middle and outer cups 42 and 43 are at their closest positions.

The inner, middle and outer cups 41, 42 and 43 are capable of moving up and down independently of each other. To be specific, the inner, middle and outer cups 41, 42 and 43 are given their respective lifting mechanisms (not shown in the drawings) that move corresponding ones of the inner, middle and outer cups 41, 42 and 43 up and down separately. Various publicly known mechanisms such as a ball screw mechanism and an air cylinder may be employed as these lifting mechanisms.

The partition plate 15 divides the space inside the chamber 10 and surrounding the processing cup 40 into parts, one above the other. The partition plate 15 may be a single plate-like member surrounding the processing cup 40, or may be formed by joining a plurality of plate-like members together. Also, the partition plate 15 may be given a through hole passing through the partition plate 15 in the thickness direction or a notch. In the preferred embodiment, the partition plate 15 is given through holes causing support shafts to pass therethrough that support the nozzle bases 33 and 63 of the upper processing solution nozzle 30 and the two-fluid nozzle 60 respectively.

The outer circumferential edge of the partition plate 15 is coupled to the side wall 11 of the chamber 10. A peripheral portion of the partition plate 15 surrounding the processing cup 40 has a circular shape of a diameter larger than the outer diameter of the outer cup 43. So, the partition plate 15 will not prevent up and down movement of the outer cup 43.

An exhaust duct 18 is provided to part of the side wall 11 of the chamber 10 and at a position near the floor wall 13. The exhaust duct 18 is communicatively connected to an exhaust mechanism not shown in the drawings. Clean air is supplied from the fan filter unit 14 to flow down inside the chamber 10, and part of the clean air after passing through space between the processing cup 40 and the partition plate 15 is drawn out of the substrate processing apparatus 1 through the exhaust duct 18.

The hardware structure of the controller 9 in the substrate processing apparatus 1 is the same as that of a generally used computer. To be specific, the controller 9 includes a CPU responsible for various arithmetic operations, a ROM that is a read-only memory storing a basic program, a RAM that is a memory from and into which various information can be read and written freely, a magnetic disk storing control software and data, and the like. Execution of a predetermined processing program by the CPU of the controller 9 makes the controller 9 control each operating mechanism of the substrate processing apparatus 1, thereby realizing processing in the substrate processing apparatus 1.

The operation of the substrate processing apparatus 1 having the aforementioned structure is described next. Procedure generally taken by the substrate processing apparatus 1 to process a substrate W briefly includes predetermined process with a chemical solution by supplying a chemical solution onto a surface of the substrate W, subsequent rinsing process with de-ionized water by supplying de-ionized water, and then subsequent spin-drying process by causing the substrate W to rotate at high speed. For processing of the substrate W, the substrate W is held on the spin chuck 20, and the processing cup 40 moves up and down. By way of example, for process with a chemical solution, only the outer cup 43 moves up to form an opening surrounding the substrate W held on the spin chuck 20 between the upper end portion 43b of the outer cup 43 and the second guide section 52 of the middle cup 42 (see FIG. 7). In this condition, the substrate W is caused to rotate together with the spin chuck 20 while chemical solutions are supplied onto the upper and lower surfaces of the substrate W through the upper and lower processing solution nozzles 30 and 28 respectively. The chemical solutions thereby supplied are caused to flow over the upper and lower surfaces of the substrate W by centrifugal force generated by the rotation of the substrate W, and then scattered laterally from the peripheral edge portion of the substrate W, by which the process with a chemical solution of the substrate W proceeds. The chemical solutions scattered from the peripheral edge portion of the rotating substrate W are received by the upper end portion 43b of the outer cup 43, pass through the inner surface of the outer cup 43, and are then recovered in the outer recovery slot 51.

For rinsing process with de-ionized water, all the inner, middle and outer cups 41, 42 and 43 move up, for example, so that a substrate W held on the spin chuck 20 is surrounded by the first guide section 47 of the inner cup 41 (see FIG. 9). In this condition, the substrate W is caused to rotate together with the spin chuck 20 while de-ionized water is supplied onto the upper and lower surfaces of the substrate W from the upper and lower processing solution nozzles 30 and 28 respectively. The de-ionized water thereby supplied is caused to flow over the upper and lower surfaces of the substrate W by centrifugal force generated by the rotation of the substrate W, and then scattered laterally from the peripheral edge portion of the substrate W, by which the rising process with de-ionized water of the substrate W proceeds. The de-ionized water scattered from the peripheral edge portion of the rotating substrate W flows down along the inner wall of the first guide section 47, and then discharged through the disposal slot 49. In order for de-ionized water to be recovered in a path different from the path of recovery of a chemical solution, the middle and outer cups 42 and 43 may be caused to move up to form an opening surrounding a substrate W held on the spin chuck 20 between the upper end portion 52b of the second guide section 52 of the middle cup 42 and the upper end portion 47b of the first guide section 47 of the inner cup 41 (see FIG. 8).

For spin-drying process, all the inner, middle and outer cups 41, 42 and 43 move down to place each of the upper end portion 47b of the first guide section 47 of the inner cup 41, the upper end portion 52b of the second guide section 52 of the middle cup 42, and the upper end portion 43b of the outer cup 43 below a substrate W held on the spin chuck 20. In this condition, the substrate W is caused to rotate together with the spin chuck 20 at high speed to blow water droplets off the substrate W by using centrifugal force, thereby realizing the drying process.

In the aforementioned surface processing realized by supplying a processing solution onto a substrate W, while most of the processing solution scattered from the rotating substrate W is recovered in the processing cup 40, part of the processing solution is converted into mist form and such processing solution in mist form may be scattered as far as to the outside of the processing cup 40. The processing solution scattered outside of the processing cup 40 reaches as far as the outer upper surface of the processing cup 40 or the partition plate 15, and is then attached to the outer upper surface or the partition plate 15. The outer upper surface of the processing cup 40 mentioned here corresponds to an outer upper surface 43d of the upper end portion 43b of the outer cup 43 in the outermost position. The processing solution attached to the outer upper surface 43d of the processing cup 40 or the upper surface of the partition plate 15 may become a source of pollution as it may generate particles and the like after being dried.

Figure 3:
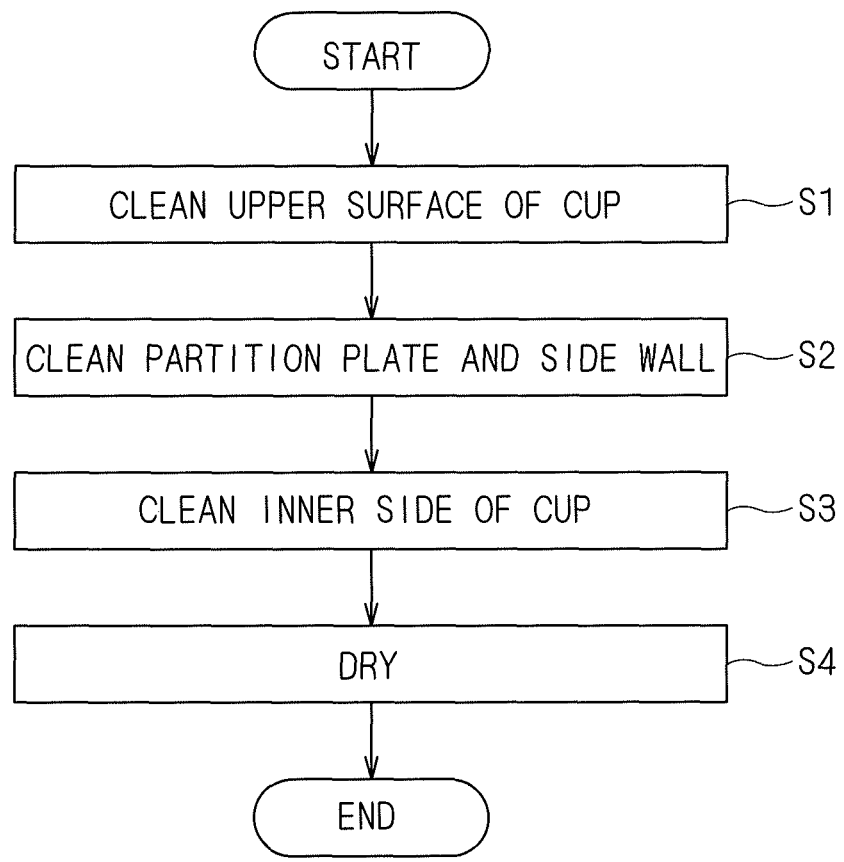
FIG. 3 is a flow diagram explaining procedure of the cleaning method of the present invention.

So, in the preferred embodiment, the outer upper surface 43d of the processing cup 40 and the upper surface of the partition plate 15 are cleaned in the following manner. FIG. 3 is a flow diagram explaining procedure of the cleaning method of the present invention. Cleaning process of the preferred embodiment is performed when there is no substrate W in the substrate processing apparatus 1, and is preferably performed at a time during an interval between processing lots.

First, the outer upper surface 43d of the processing cup 40 is cleaned (step S1). While there is no substrate W in the substrate processing apparatus 1, namely while there is no substrate W held on the spin chuck 20, all the inner, middle and outer cups 41, 42 and 43 move down to their lowest positions. This places each of the upper end portion 47b of the first guide section 47 of the inner cup 41, the upper end portion 52b of the second guide section 52 of the middle cup 42, and the upper end portion 43b of the outer cup 43 below the holding surface 21a of the spin base 21 of the spin chuck 20 (corresponding to the condition of FIG. 2). In this condition, the spin base 21 of the spin chuck 20 is driven by the spin motor 22 to rotate about the axis of rotation CX. The number of revolutions of the spin base 21 in step S1 is from 250 rpm to 350 rpm (first number of revolutions), and this number of revolutions is controlled by the controller 9.

The upper end of the processing cup 40 (upper end portions 47b, 52b and 43b) is placed below the holding surface 21a of the spin base 21 while the spin base 21 is caused to rotate at a number of revolutions of from 250 rmp to 350 rpm. Further, the nozzle base 33 of the upper processing solution nozzle 30 causes the nozzle arm 32 to pivot to move the discharge head 31 to a position above the spin base 21. Then, a cleaning solution (in the preferred embodiment, de-ionized water) is supplied through the discharge head 31 onto the holding surface 21a of the rotating spin base 21.

At this time, the nozzle base 33 makes swinging movement of the nozzle arm 32 under control of the controller 9 to cause the discharge head 31 supplying de-ionized water to move back and forth over the spin base 21 as shown in FIG. 4. As an example, this reciprocating movement is made by causing the discharge head 31 to move repeatedly between one edge and the opposite edge of the spin base 21 in the form of a circular plate in the direction of the diameter thereof. This reciprocating movement is not limited to continuous reciprocating movement where the discharge head 31 is caused to move continuously. This reciprocating movement may also be intermittent reciprocating movement where the discharge head 31 moves to the opposite edge and stops for a while there after stopping at the one edge for a while, and then moves back to the one edge and stops there for a while.

In response to supply of de-ionized water onto the holding surface 21a of the rotating spin base 21, the de-ionized water is scattered laterally from the peripheral edge portion of the holding surface 21a by centrifugal force. The upper end of the processing cup 40 is placed below the holding surface 21a of the spin base 21, so the de-ionized water scattered from the rotating holding surface 21a falls onto the outer upper surface 43d of the processing cup 40 (more specifically, the outer upper surface 43d of the outer cup 43) as shown in FIG. 5. Falling of the scattered de-ionized water washes away a processing solution attached to the outer upper surface 43d of the processing cup 40 to clean the outer upper surface 43d.

If the discharge head 31 is above one edge of the spin base 21 in the direction of the diameter thereof, a large amount of de-ionized water falls onto the outer upper surface 43d of the processing cup 40 in a region close to the one edge to clean this region favorably. Meanwhile, if the discharge head 31 is above the opposite edge of the spin base 21, a large amount of de-ionized water falls onto the outer upper surface 43d of the processing cup 40 in a region close to the opposite edge to clean this region favorably. Thus, the reciprocating movement of the discharge head 31 of the upper processing solution nozzle 30 over the spin base 21 makes it possible to clean the entire outer upper surface 43d of the processing cup 40 favorably.

The partition plate 15 and the side wall 11 of the chamber 10 are cleaned (step S2) after the outer upper surface 43d of the processing cup 40 is cleaned. In this step, while all the inner, middle and outer cups 41, 42 and 43 are also at their lowest positions around the spin chuck 20 on which no substrate W is held, the spin base 21 rotates about the axis of rotation CX. The number of revolutions of the spin base 21 in step S2 is from 350 rpm to 450 rpm (second number of revolutions) higher than the first number of revolutions of step S1. This means that the controller 9 only increases the number of revolutions of the spin base 21 in order to make a transition from step S1 to step S2.

The upper end of the processing cup 40 (upper end portions 47b, 52b and 43b) is placed below the holding surface 21a of the spin base 21. In this condition, de-ionized water is supplied through the discharge head 31 onto the holding surface 21a while the spin base 21 is caused to rotate at a number of revolutions of from 350 rpm to 450 rpm. At this time, like in step S1, the discharge head 31 supplying de-ionized water is caused to move back and forth over the spin base 21.

In response to supply of de-ionized water onto the holding surface 21a of the rotating spin base 21, the de-ionized water is scattered laterally from the peripheral edge portion of the holding surface 21a by centrifugal force. The upper end of the processing cup 40 is placed below the holding surface 21a of the spin base 21, and the spin base 21 rotates at a number of revolutions higher than that employed in cleaning of the upper surface of the cup in step S1, so greater centrifugal force acts on the de-ionized water. As a result, the de-ionized water scattered from the rotating holding surface 21a travels a longer distance than that of step S1 to fall onto the upper surface of the partition plate 15 and the side wall 11 of the chamber 10 as shown in FIG. 6. Falling of the de-ionized water scattered from the spin base 21 cleans the upper surface of the partition plate 15 and the side wall 11 of the chamber 10.

Like in the cleaning of the upper surface of the cup in step S1, if the discharge head 31 is above one edge of the spin base 21 in the direction of the diameter thereof, a large amount of de-ionized water falls onto the partition plate 15 and the side wall 11 in a region close to the one edge. Meanwhile, if the discharge head 31 is above the opposite edge of the spin base 21, a large amount of de-ionized water falls onto the partition plate 15 and the side wall 11 in a region close to the opposite edge. Thus, the reciprocating movement of the discharge head 31 over the spin base 21 makes it possible to clean the entire upper surface of the partition plate 15 and the entire side wall 11 of the chamber 10 favorably.

Next, the inner side of the processing cup 40 is cleaned (step S3). The processing cup 40 includes the inner, middle and outer cups 41, 42 and 43 that are capable of moving up and down independently of each other. The respective inner surfaces of the inner, middle and outer cups 41, 42 and 43 function as guide sections. To be specific, the processing cup 40 includes a plurality of guides sections extending in the direction of the height of the processing cup 40. For cleaning of the inner side of the cup, the outer cup 43, the middle cup 42, and the inner cup 41 move up sequentially around the spin chuck 20 on which no substrate W is held. Then, the spin base 21 of the spin chuck 20 is driven by the spin motor 22 to rotate about the axis of rotation CX. The number of revolutions of the spin base 21 in step S3 is from 100 rpm to 200 rpm (third number of revolutions) smaller than the first number of revolutions of step S1.

Figure 7:
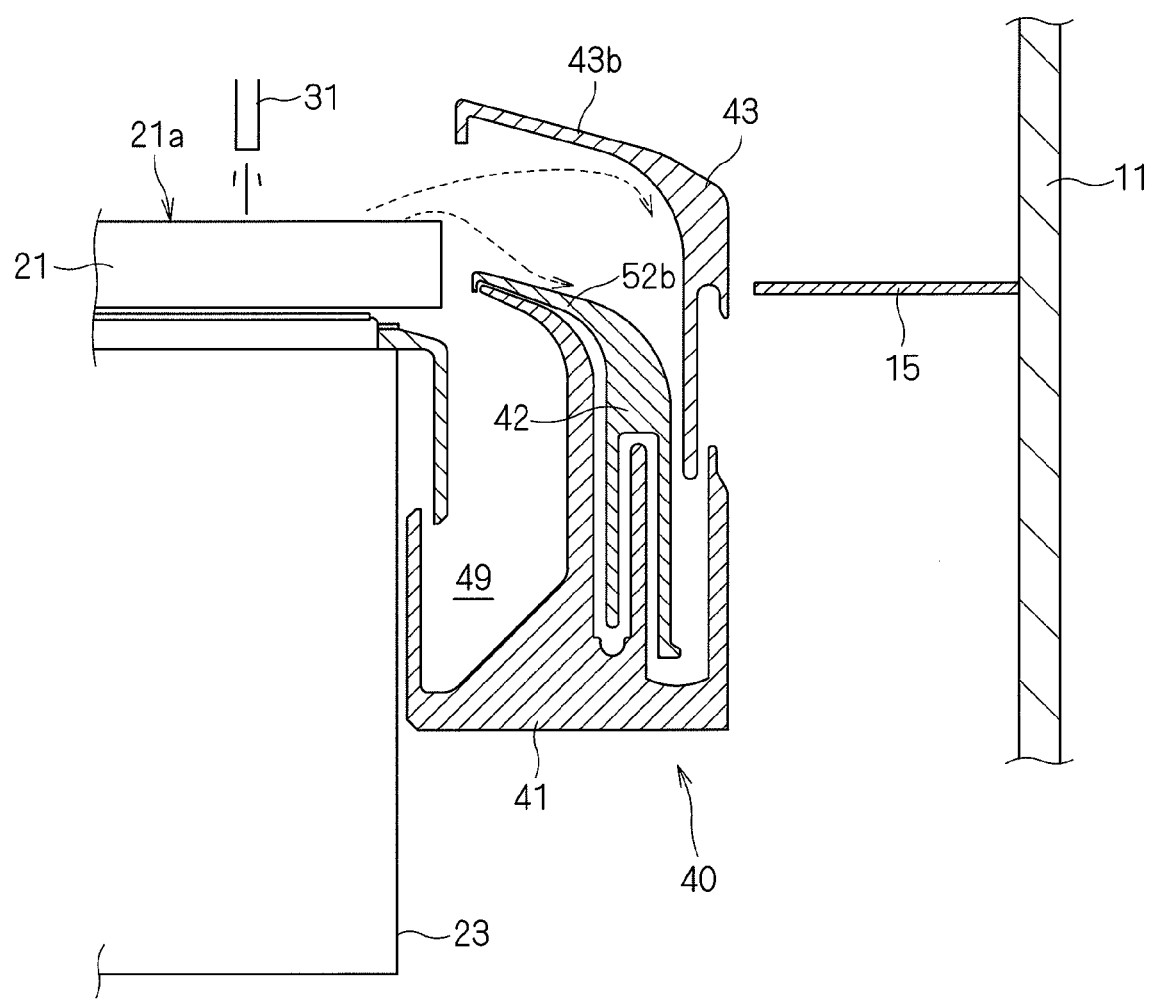
FIG. 7 shows how the inner side of an outer cup is cleaned.

For cleaning of the inner side of the outer cup 43, only the outer cup 43 moves up as shown in FIG. 7. This places the upper end portion 43b of the outer cup 43 above the holding surface 21a of the spin base 21 to form an opening surrounding the holding surface 21a of the spin base 21 between the upper end portion 43b of the outer cup 43 and the upper end portion 52b of the middle cup 42. Thus, the outer cup 43 functioning as the third guide section surrounds the holding surface 21a of the spin base 21 at the same height as the holding surface 21a. In this condition, de-ionized water is supplied through the discharge head 31 onto the holding surface 21a while the spin base 21 is caused to rotate at a number of revolutions of from 100 rmp to 200 rpm. Further, like in steps S1 and S2 described above, the discharge head 31 supplying de-ionized water is caused to move back and forth over the spin base 21.

Supplying de-ionized water through the discharge head 31 onto the holding surface 21a while causing the spin base 21 to rotate generates centrifugal force, and this centrifugal force scatters the de-ionized water from the peripheral edge portion of the holding surface 21a toward the inner side of the outer cup 43. As shown in FIG. 7, the de-ionized water scattered from the holding surface 21a of the spin base 21 falls onto the inner surface of the outer cup 43, and at the same time, onto the outer upper surface of the middle cup 42, thereby cleaning the inner surface of the outer cup 43 and the outer upper surface of the middle cup 42. Like in the aforementioned cases, the reciprocating movement of the discharge head 31 over the spin base 21 makes it possible to clean the entire inner side of the outer cup 43 favorably.

Figure 8:
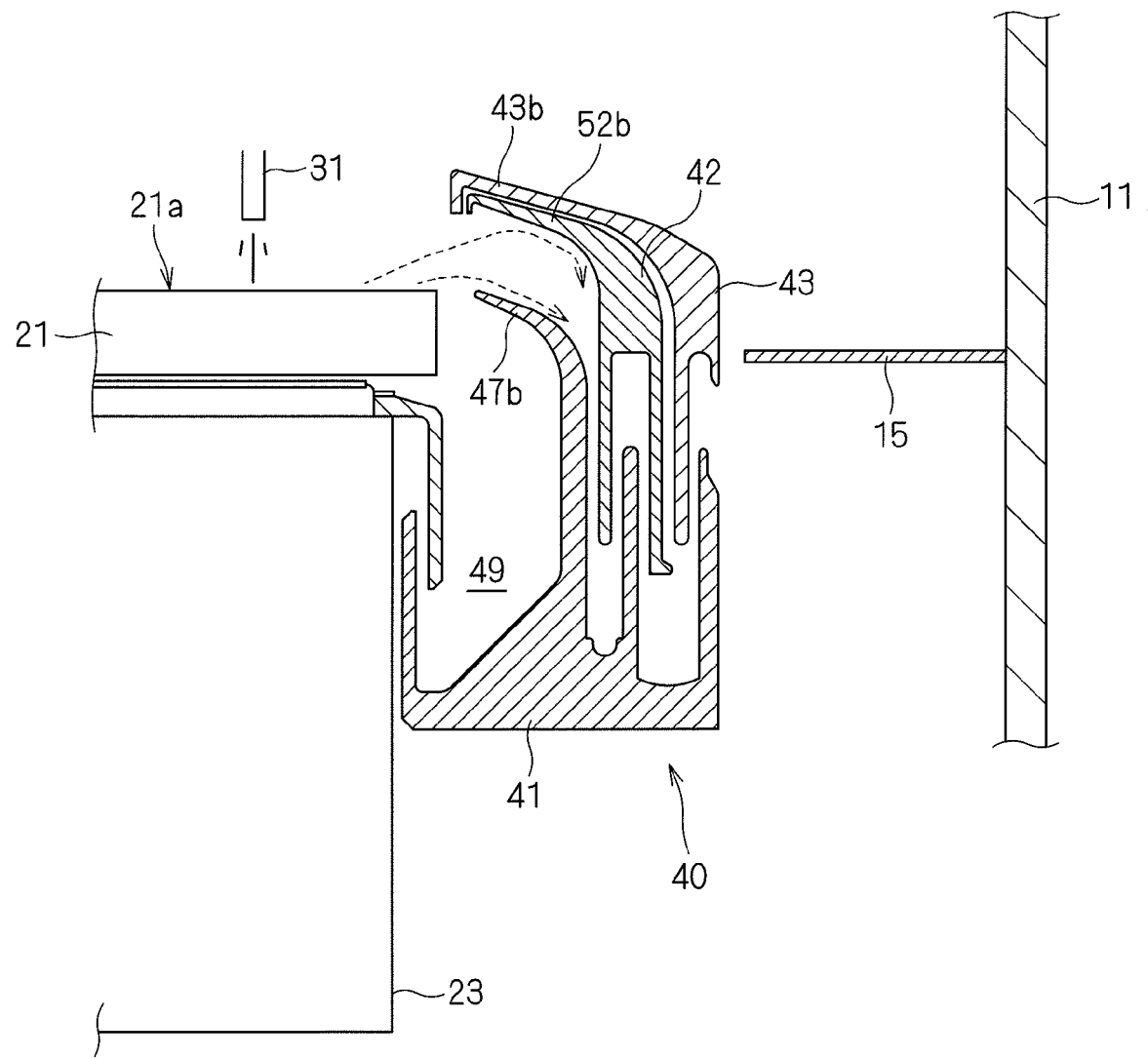
FIG. 8 shows how the inner side of a middle cup is cleaned.

For cleaning of the inner side of the middle cup 42, the outer and middle cups 43 and 42 move up (only the inner cup 41 is at a lower position) as shown in FIG. 8. This places the upper end portion 43b of the outer cup 43 and the upper end portion 52b of the middle cup 42 above the holding surface 21a of the spin base 21 to form an opening surrounding the holding surface 21a of the spin base 21 between the upper end portion 52b of the middle cup 42 and the upper end portion 47b of the inner cup 41. Thus, the second guide section 52 of the middle cup 42 surrounds the holding surface 21a of the spin base 21 at the same height as the holding surface 21a. In this condition, de-ionized water is supplied through the discharge head 31 onto the holding surface 21a while the spin base 21 is caused to rotate at a number of revolutions of from 100 rmp to 200 rpm. Further, like in the aforementioned cases, the discharge head 31 supplying de-ionized water is caused to move back and forth over the spin base 21.

Supplying de-ionized water through the discharge head 31 onto the holding surface 21a while causing the spin base 21 to rotate generates centrifugal force, and this centrifugal force scatters the de-ionized water from the peripheral edge portion of the holding surface 21a toward the inner side of the middle cup 42. As shown in FIG. 8, the de-ionized water scattered from the holding surface 21a of the spin base 21 falls onto the inner surface of the middle cup 42, and at the same time, onto the outer upper surface of the inner cup 41, thereby cleaning the inner surface of the middle cup 42 (second guide section 52) and the outer upper surface of the inner cup 41. Further, the reciprocating movement of the discharge head 31 over the spin base 21 makes it possible to clean the entire inner side of the middle cup 42 favorably.

For cleaning of the inner side of the inner cup 41, all the outer, middle and inner cups 43, 42 and 41 move up as shown in FIG. 9. This places all of the upper end portion 43b of the outer cup 43, the upper end portion 52b of the middle cup 42, and the upper end portion 47b of the inner cup 41 above the holding surface 21a of the spin base 21 to make the first guide section 47 of the inner cup 41 surround the holding surface 21a of the spin base 21 at the same height as the holding surface 21a. In this condition, de-ionized water is supplied through the discharge head 31 onto the holding surface 21a while the spin base 21 is caused to rotate at a number of revolutions of from 100 rmp to 200 rpm. Further, the discharge head 31 supplying de-ionized water is caused to move back and forth over the spin base 21.

Supplying de-ionized water through the discharge head 31 onto the holding surface 21a while causing the spin base 21 to rotate generates centrifugal force, and this centrifugal force scatters the de-ionized water from the peripheral edge portion of the holding surface 21a toward the inner side of the inner cup 41. As shown in FIG. 9, the de-ionized water scattered from the holding surface 21a of the spin base 21 falls onto the inner surface of the inner cup 41 (first guide section 47), thereby cleaning the inner surface of the inner cup 41. Further, the reciprocating movement of the discharge head 31 over the spin base 21 makes it possible to clean the entire inner side of the inner cup 41 favorably.

As described above, in step S3, the three guide sections formed of the respective inner surfaces of the inner, middle and outer cups 41, 42 and 43 are cleaned while these guide sections are placed at the same height as the holding surface 21a of the spin base 21.

Drying process (step S4) follows the aforementioned cleaning process of the inner side of the processing cup 40. For the drying process, like in steps S1 and S2, all the inner, middle and outer cups 41, 42 and 43 move down to their lowest positions to place the upper end of the processing cup 40 (upper end portions 47b, 52b and 43b) below the holding surface 21a of the spin base 21. Further, the discharge head 31 of the upper processing solution nozzle 30 moves to the standby position outside the processing cup 40. In this condition, the spin base 21 of the spin chuck 20 is driven by the spin motor 22 to rotate at high speed about the axis of rotation CX. The number of revolutions of the spin base 21 during the drying process in step S4 is about 2500 rpm (fourth number of revolutions) considerably higher than the second number of revolutions of step S2.

FIG. 10 shows the drying process realized by the rotation of the spin base 21. The spin base 21 with the chuck members 26 provided at peripheral edges of the holding surface 21a rotates at high speed to generate spiral airflow in the chamber 10. The airflow generated as a result of the rotation of the spin base 21 is sprayed to dry the outer upper surface 43d of the processing cup 40, the upper surface of the partition plate 15, and the side wall 11 of the chamber 10.

An inert gas (in the preferred embodiment, nitrogen ($N_2$) gas) is sprayed from the two-fluid nozzle 60 onto the outer upper surface 43d of the processing cup 40 while the spin base 21 rotates. At this time, liquid is not supplied to the two-fluid nozzle 60 but the inert gas is supplied to the gas head 64 to discharge only the inert gas through the gas head 64. Further, the nozzle base 63 of the two-fluid nozzle 60 may make the nozzle arm 62 swing to move the gas head 64 through which the inert gas is sprayed over the processing cup 40 and the partition plate 15. The airflow generated by the rotation of the spin base 21 and spray of the inert gas through the two-fluid nozzle 60 make it possible to dry the outer upper surface 43d of the processing cup 40 and the partition plate 15 at enhanced efficiency.

In the preferred embodiment, the spin base 21 of the spin chuck 20 is caused to rotate at a number of revolutions of from 250 rmp to 350 rpm (first number of revolutions), and at the same time, a cleaning solution is supplied from the upper processing solution nozzle 30 onto the holding surface 21a while the upper end of the processing cup 40 surrounding the spin base 21 is placed below the holding surface 21a of the spin base 21. The outer upper surface 43d of the processing cup 40 is cleaned with the cleaning solution scattered from the holding surface 21a of the rotating spin base 21.

Further, the spin base 21 is caused to rotate at a number of revolutions of from 350 rmp to 450 rpm (second number of revolutions) higher than the first number of revolutions, and at the same time, a cleaning solution is supplied from the upper processing solution nozzle 30 onto the holding surface 21a of the spin base 21. The partition plate 15 and the side wall 11 of the chamber 10 outside the processing cup 40 are cleaned with the cleaning solution scattered from the rotating holding surface 21a.

The components of the substrate processing apparatus 1 including the spin chuck 20, the processing cup 40, and the upper processing solution nozzle 30 are all originally intended to perform surface processing on a substrate W, and the operations thereof are based on the assumption that a substrate W is held on the spin chuck 20. To be specific, these components provided in the chamber 10 are not intended to clean a member other than a substrate W.

In the preferred embodiment, while the spin chuck 20 on which a substrate W is not held is caused to rotate, a cleaning solution is supplied from the upper processing solution nozzle 30 onto the holding surface 21a of the spin base 21. The cleaning solution scattered from the rotating spin base 21 by resultant centrifugal force is used to clean the outer upper surface 43d of the processing cup 40, the partition plate 15, and the side wall 11 of the chamber 10. This means that the preferred embodiment makes it possible to clean the outer upper surface 43d of the processing cup 40 and surroundings of the processing cup 40 without requiring a special-purpose cleaning mechanism.

Also, in the preferred embodiment, a target of cleaning can be changed from the outer upper surface 43d of the processing cup 40 to an area outside the processing cup 40 and surrounding the processing cup 40 by merely causing the controller 9 to control the number of revolutions of the spin base 21. Thus, the outer upper surface 43d of the processing cup 40 and the surroundings of the processing cup 40 can be cleaned sequentially without the need of specifically preparing a special-purpose mechanism. During cleaning of the inner side of the processing cup 40 in step S3, inner and outer surfaces of two adjacent cups placed one above the other can be cleaned sequentially by making fine control of the number of revolutions of the spin base 21. As an example, increasing the number of revolutions of the spin base 21 in the condition shown in FIG. 7 makes it possible to change a target of cleaning from the outer upper surface of the middle cup 42 to the inner surface of the outer cup 43. Likewise, increasing the number of revolutions of the spin base 21 in the condition shown in FIG. 8 makes it possible to change a target of cleaning from the outer upper surface of the inner cup 41 to the inner surface of the middle cup 42.

The present invention is not limited to the preferred embodiment described above, but various modifications thereof can be made without departing from the substance of the present invention. As an example, the preferred embodiment uses de-ionized water as a cleaning solution used in steps S1 to S3. However, de-ionized water is not the only example of a cleaning solution, but a cleaning solution may also be a solution formed by diluting a chemical solution with de-ionized water.

In the preferred embodiment described above, the upper processing solution nozzle 30 is used as a nozzle for supplying a cleaning solution onto the holding surface 21a of the spin base 21. Meanwhile, the two-fluid nozzle 60 may take the place of the upper processing solution nozzle 30 to supply a cleaning solution to the spin base 21 in steps S1 to S3. The two-fluid nozzle 60 is also originally provided to perform surface processing on a substrate W, and is not intended to clean a member other than a substrate W.

In step S2, the number of revolutions of the spin base 21 is increased to clean the partition plate 15 and the side wall 11 of the chamber 10. Meanwhile, components existing between the processing cup 40 and the side wall 11 can also be cleaned in the absence of the partition plate 15. To be specific, what should be done in step S2 is to clean an area outside the processing cup 40 and surrounding the processing cup 40 with a cleaning solution scattered from the holding surface 21a of the rotating spin base 21.

Further, in the preferred embodiment described above, the processing cup 40 includes the inner, middle and outer cups 41, 42 and 43 that are capable of moving up and down independently of each other. Meanwhile, the processing cup 40 may alternatively include integrally formed three cups that make up and movements. If integrally formed three cups are placed one above the other at several stages, these cups may sequentially move up and down to surround the holding surface 21a of the spin base 21 in step S3. Or, the processing cup 40 may include a cup only at one stage surrounding the spin base 21.

Also, in the preferred embodiment described above, nitrogen gas is sprayed from the two-fluid nozzle 60 onto the outer upper surface 43d of the processing cup 40. Meanwhile, a gas to be sprayed may be an inert gas of a different type (such as argon (Ar)), or gas other than an inert gas (such as air).

A substrate to be processed by the substrate processing apparatus 1 is not limited to a semiconductor substrate, but it may also be a glass substrate used in a flat-panel display such as a liquid crystal display.

While the invention has been shown and described in detail, the foregoing description is in all aspects illustrative and not restrictive. It is therefore understood that numerous modifications and variations can be devised without departing from the scope of the invention.

What is claimed is:

1. A method of cleaning a substrate processing apparatus that performs substrate processing with a processing solution, the method comprising the steps of: (a) causing a substrate holding element to rotate at a first number of revolutions, the substrate holding element having a holding surface facing a lower surface of a substrate to be held on the substrate holding element, and at the same time, supplying a cleaning solution from a cleaning solution supply nozzle onto said holding surface while placing an upper end of a cup surrounding said substrate holding element below said substrate holding element, thereby cleaning an outer upper surface of said cup with said cleaning solution scattered from said holding surface while said holding surface is rotating; and (b) causing the substrate holding element to rotate at a second number of revolutions higher than said first number of revolutions, and at the same time, supplying a cleaning solution from said cleaning solution supply nozzle onto said holding surface, wherein in said steps (a) and (b), said cleaning solution is supplied from said cleaning solution supply nozzle onto said holding surface when said holding surface does not hold said substrate, thereby cleaning an area outside said cup and surrounding said cup with said cleaning solution scattered from said holding surface while said holding surface is rotating, said area outside said cup including at least a part of a side wall of a chamber of said substrate processing apparatus.

2. The method according to claim 1, wherein, in said steps (a) and (b), said cleaning solution supply nozzle for supplying a cleaning solution is caused to move over said holding surface.

3. The method according to claim 1, further comprising the step of: (c) causing said substrate holding element to rotate at a third number of revolutions smaller than said first number of revolutions, and at the same time, supplying a cleaning solution from said cleaning solution supply nozzle onto said holding surface while placing the upper end of said cup above said substrate holding element, thereby cleaning the inner side of said cup with said cleaning solution scattered from said holding surface while said holding surface is rotating.

4. The method according to claim 3, wherein said cup is provided with a plurality of guide sections extending in the direction of the height of said cup, and in said step (c), each of said guide sections is cleaned while each of said guide sections is placed at the same height as said substrate holding element.

5. The method according to claim 1, further comprising the step of: (d) drying said outer upper surface of said cup and said area outside said cup with airflow generated by causing said substrate holding element to rotate at a fourth number of revolutions higher than said second number of revolutions.

6. The method according to claim 5, wherein, in said step (d), gas is discharged from a gas supply nozzle onto at least said outer upper surface of said cup.

7. The method according to claim 1, wherein in said step (b), said cleaning solution is supplied from said cleaning solution supply nozzle onto said holding surface while placing the upper end of said cup below said substrate holding element.

8. The method according to claim 1, wherein said area outside said cup includes a partition plate partitioning the inner space of said chamber vertically.

* * * * *